(12) United States Patent
Senda et al.

(10) Patent No.: US 9,859,104 B2
(45) Date of Patent: Jan. 2, 2018

(54) TANTALUM SPUTTERING TARGET AND PRODUCTION METHOD THEREFOR

(71) Applicant: JX Nippon Mining & Metals Corporation, Tokyo (JP)

(72) Inventors: Shinichiro Senda, Ibaraki (JP); Kotaro Nagatsu, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 225 days.

(21) Appl. No.: 14/654,866

(22) PCT Filed: Feb. 28, 2014

(86) PCT No.: PCT/JP2014/055075
§ 371 (c)(1),
(2) Date: Jun. 23, 2015

(87) PCT Pub. No.: WO2014/136679
PCT Pub. Date: Sep. 12, 2014

(65) Prior Publication Data
US 2015/0348765 A1    Dec. 3, 2015

(30) Foreign Application Priority Data
Mar. 4, 2013 (JP) .................. 2013-041718

(51) Int. Cl.
*C23C 14/00* (2006.01)
*H01J 37/34* (2006.01)
(Continued)

(52) U.S. Cl.
CPC .......... *H01J 37/3426* (2013.01); *C22C 27/02* (2013.01); *C22F 1/00* (2013.01); *C22F 1/18* (2013.01); *C23C 14/3414* (2013.01)

(58) Field of Classification Search
CPC .................................................. C23C 14/3414
See application file for complete search history.

(56) References Cited

U.S. PATENT DOCUMENTS 6,238,494 B1    5/2001    Segal
6,348,139 B1    2/2002    Shah et al.
(Continued)

FOREIGN PATENT DOCUMENTS

EP    0902102 A1    3/1999
JP    2002-363736 A    12/2002
(Continued)

OTHER PUBLICATIONS

C.A. Michaluk, "Correlating Discrete Orientation and Grain Size to the Sputter Deposition Properties of Tantalum", Journal of Electronic Materials, vol. 31, No. 1, pp. 2-9, Jan. 2002.
(Continued)

*Primary Examiner* — Timon Wanga
(74) *Attorney, Agent, or Firm* — Howson & Howson LLP

(57) ABSTRACT

A tantalum sputtering target, wherein on a sputtering surface of the tantalum sputtering target, an orientation rate of a (200) plane is 70% or less, an orientation rate of a (222) plane is 10% or more, an average crystal grain size is 50 μm or more and 150 μm or less, and a variation in a crystal grain size is 30 μm or less. By controlling the crystal orientation of the target, it is possible to increase the sputter rate, consequently deposit the required film thickness in a short period of time, and improve the throughput. In addition, by controlling the crystal grain size on the sputtering surface of the target, an effect is yielded in that the abnormal discharge during sputtering can be suppressed.

15 Claims, 1 Drawing Sheet

(51) Int. Cl.
*C22C 27/02* (2006.01)
*C22F 1/00* (2006.01)
*C22F 1/18* (2006.01)
*C23C 14/34* (2006.01)

(56) References Cited

U.S. PATENT DOCUMENTS

| | | |
|---|---|---|
| 6,770,154 B2 | 8/2004 | Koenigsmann et al. |
| 7,081,148 B2 | 7/2006 | Koenigsmann et al. |
| 7,156,963 B2 | 1/2007 | Oda |
| 7,517,417 B2 | 4/2009 | Turner |
| 7,699,948 B2 | 4/2010 | Oda |
| 7,716,806 B2 | 5/2010 | Oda |
| 7,740,717 B2 | 6/2010 | Oda |
| 7,892,367 B2 | 2/2011 | Oda |
| 7,998,287 B2 | 8/2011 | Wickersham, Jr. et al. |
| 8,172,960 B2 | 5/2012 | Oda et al. |
| 8,177,947 B2 | 5/2012 | Miyashita |
| 8,231,745 B2 | 7/2012 | Wickersham, Jr. et al. |
| 8,382,920 B2 | 2/2013 | Carpenter et al. |
| 8,425,696 B2 | 4/2013 | Oda et al. |
| 8,580,053 B2 | 11/2013 | Sato et al. |
| 8,747,633 B2 | 6/2014 | Nakashima et al. |
| 2003/0052000 A1 | 3/2003 | Segal et al. |
| 2007/0023281 A1* | 2/2007 | Oda .................. C23C 14/3414 204/298.12 |
| 2009/0134021 A1* | 5/2009 | Oda .................. C23C 14/3414 204/298.13 |
| 2011/0266145 A1 | 11/2011 | Fukushima et al. |
| 2012/0031756 A1 | 2/2012 | Fukushima et al. |
| 2012/0037501 A1 | 2/2012 | Fukushima et al. |
| 2012/0061672 A1 | 3/2012 | O'Rourke et al. |
| 2012/0132523 A1 | 5/2012 | Hagihara et al. |
| 2012/0267236 A1 | 10/2012 | Nakashima et al. |
| 2013/0092534 A1 | 4/2013 | Senda et al. |
| 2013/0098759 A1 | 4/2013 | Senda et al. |
| 2014/0242401 A1 | 8/2014 | Senda et al. |
| 2015/0064056 A1 | 3/2015 | Nagatsu et al. |
| 2015/0279637 A1 | 10/2015 | Senda et al. |
| 2015/0329959 A1 | 11/2015 | Senda et al. |
| 2016/0208377 A1 | 7/2016 | Oda |
| 2016/0217983 A1 | 7/2016 | Oda |

FOREIGN PATENT DOCUMENTS

| | | |
|---|---|---|
| JP | 2007-126748 A | 5/2007 |
| WO | 2009/107763 A1 | 9/2009 |

OTHER PUBLICATIONS

Q. Yuan et al., "Investigation on Microstructure and Texture in High Pure Tantalum Sputtering Targets by EBSD", Journal of Chinese Electron Microscopy Society, vol. 29, No. 1, pp. 85-88, Jan. 2010.

* cited by examiner

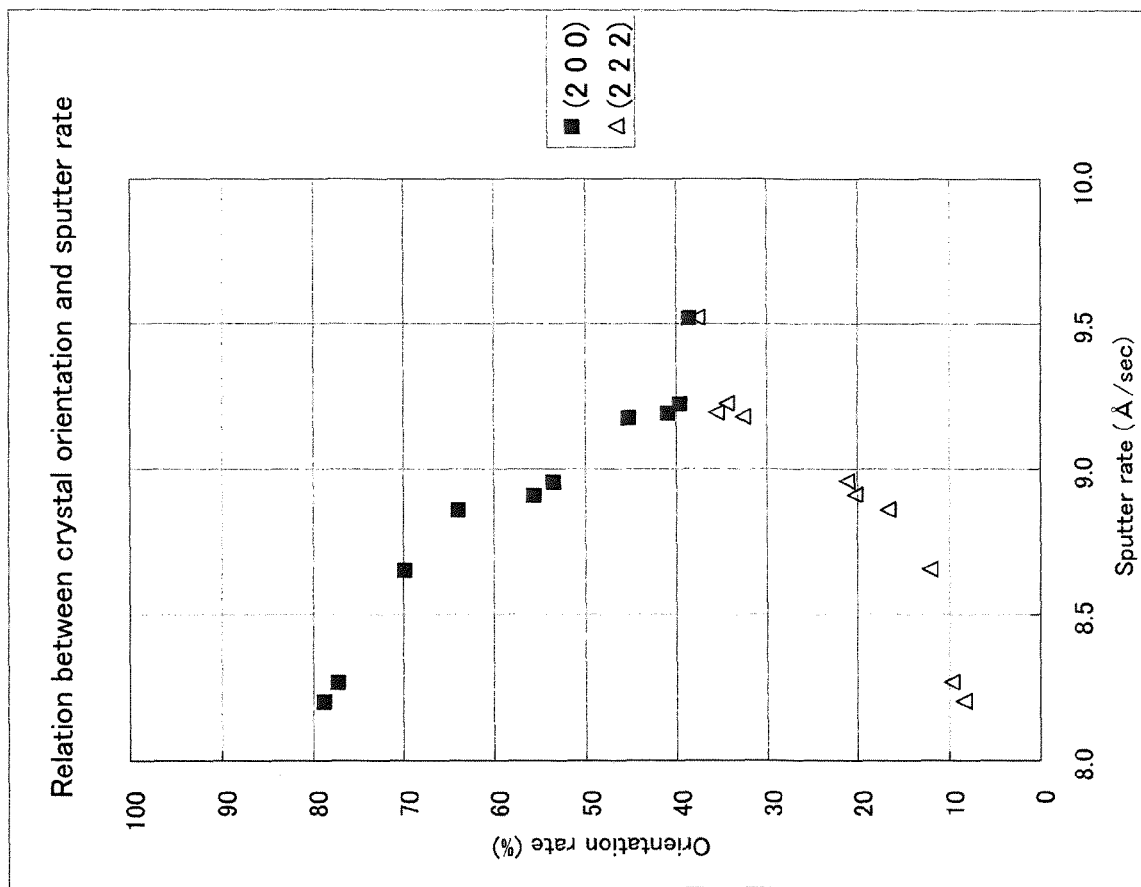

TANTALUM SPUTTERING TARGET AND PRODUCTION METHOD THEREFOR

BACKGROUND

The present invention relates to a tantalum sputtering target and a method for producing such a tantalum sputtering target. In particular, the present invention relates to a tantalum sputtering target that is used for forming a Ta film or a TaN film as a diffusion barrier layer of a copper wiring in an LSI, and to a method for producing such a tantalum sputtering target.

Conventionally, aluminum was used as the wiring material of semiconductor devices, but pursuant to the miniaturization and higher integration of the devices, the problem of wiring delay became an issue, and copper having smaller electrical resistance than aluminum is now being used. While copper is extremely effective as a wiring material, since copper itself is an active metal, there is a problem in that copper diffuses and contaminates the interlayer insulating film, and it is necessary to form a diffusion barrier layer made from a Ta film or a TaN film between the copper wiring and the interlayer insulating film.

Generally speaking, a Ta film or a TaN film is deposited by sputtering a tantalum target. As factors that affect the performance of a tantalum target during sputtering, it is known that the various impurities and gas components contained in the target, and the plane orientation and crystal grain size of the crystals affect the deposition rate, film thickness uniformity, generation of particles, and the like.

For example, Patent Document 1 describes improving the uniformity of the film by forming a crystal structure in which the (222) orientation is preferential from the position of 30% of the target thickness toward the central plane of the target. Moreover, Patent Document 2 describes increasing the deposition rate and improving the uniformity of the film by causing the crystal orientation of the tantalum target to be random (no alignment to a specific crystal orientation). Moreover, Patent Document 3 describes improving the deposition rate by selectively increasing the plane orientations of (110), (200), (211), which have a high atomic density, on the sputtering surface, and improving the uniformity by suppressing the variation in the plane orientation.

In addition, Patent Document 4 describes improving the film thickness uniformity by causing the variation in the intensity ratio of the (110) plane obtained based on X-ray diffraction, depending on the location of the sputtering surface, to be within 20%. Moreover, Patent Document 5 describes that a round metal target having an extremely strong crystallographic texture such as (111) or (100) can be prepared by combining swaging, extrusion, rotary forging, and non-lubrication upset forging with clock rolling. Nevertheless, when these tantalum targets were sputtered, there was a problem in that the sputter rate (deposition rate) was not necessarily high, and the throughput was inferior.

In addition, Patent Document 6 describes a method of producing a tantalum sputtering target by subjecting a tantalum ingot to forging, annealing and rolling, and, after processing the tantalum ingot into its final composition, performing annealing thereto at a temperature of 1173 K or less to obtain a tantalum sputtering target having a non-recrystallized structure of 20% or less, or 90% or less. Nevertheless, in the foregoing case, there is no concept of increasing the sputter rate and improving the throughput by controlling the crystal orientation.

Moreover, Patent Document 7 discloses a technique of stabilizing the sputtering characteristics by causing the relative intensity of the peak of the sputtering surface of the target to be (110)>(211)>(200) through forging, cold rolling and other processes, and heat treatment. Nevertheless, there is no concept of increasing the sputter rate and improving the throughput by controlling the crystal orientation.

In addition, Patent Document 8 describes forging a tantalum ingot, performing heat treatment two or more times during the foregoing forging process, additionally performing cold rolling, and further performing recrystallization heat treatment. Nevertheless, in the foregoing case also, there is no concept of increasing the sputter rate and improving the throughput by controlling the crystal orientation. Moreover, none of the foregoing Patent Documents disclose reducing the discharge voltage of the tantalum sputtering target so that plasma can be more easily generated and improving the stability of plasma by controlling the crystal grain size on the sputtering surface of the target.

PRIOR ART DOCUMENTS

Patent Documents

Patent Document 1: Japanese Patent Application Publication No. 2004-107758
Patent Document 2: International Publication No. 2005/045090
Patent Document 3: Japanese Patent Application Publication No. H11-80942
Patent Document 4: Japanese Patent Application Publication No. 2002-363736
Patent Document 5: Japanese Translation of PCT International Application Publication No. 2008-532765
Patent Document 6: Japanese Patent No. 4754617
Patent Document 7: International Publication No. 2011/061897
Patent Document 8: Japanese Patent No. 4714123

SUMMARY

An object of the present invention is to, in a tantalum sputtering target, increase the sputter rate by controlling the crystal orientation on the sputtering surface of the target, consequently deposit the required film thickness in a short period of time, and improve the throughput. Another object of the present invention is to reduce the discharge voltage of the tantalum target so that plasma can be more easily generated, and improve the stability of the plasma by further controlling the crystal grain size on the sputtering surface of the target. In particular, an object of this invention is to provide a tantalum sputtering target that is effective in forming a diffusion barrier layer made from a Ta film or a TaN film capable of effectively preventing contamination around the wiring caused by the diffusion of active Cu.

In order to resolve the foregoing problems, the present invention provides the following invention:

1) A tantalum sputtering target, wherein on a sputtering surface of the tantalum sputtering target, an orientation rate of a (200) plane is 70% or less, an orientation rate of a (222) plane is 10% or more, an average crystal grain size is 50 μm or more and 150 μm or less, and a variation in a crystal grain size is 30 μm or less.

2) The tantalum sputtering target according to 1) above, wherein on the sputtering surface of the tantalum sputtering target, the orientation rate of the (200) plane is 60% or less, the orientation rate of the (222) plane is 20% or more, the average crystal grain size is 50 μm or more and 150 μm or less, and the variation in the crystal grain size is 30 μm or less.

3) The tantalum sputtering target according to 1) above, wherein on the sputtering surface of the tantalum sputtering target, the orientation rate of the (200) plane is 50% or less, the orientation rate of the (222) plane is 30% or more, the average crystal grain size is 50 μm or more and 150 μm or less, and the variation in the crystal grain size is 30 μm or less.

4) A thin film for a diffusion barrier layer formed using the sputtering target according to any one of 1) to 3) above.

5) A semiconductor device that uses the thin film for a diffusion barrier layer according to 4) above.

The present invention additionally provides:

6) A method of producing the tantalum sputtering target according to any one of 1) to 3) above, wherein a molten tantalum ingot is subject to forging and recrystallization annealing, and thereafter subject to rolling and heat treatment.

7) The method of producing a tantalum sputtering target according to 6) above, wherein cold rolling is performed using a rolling mill roll having a rolling mill roll diameter of 500 mm or more at a rolling speed of 10 m/min or more and a reduction exceeding 80%.

8) The method of producing a tantalum sputtering target according to 6) above, wherein rolling and heat treatment are repeated two or more times, and cold rolling is performed using a rolling mill roll having a rolling mill roll diameter of 500 mm or more at a rolling speed of 10 m/min or more and a reduction of 60% or more.

9) The method of producing a tantalum sputtering target according to any one of 6) to 8) above, wherein heat treatment is performed at a temperature of 900° C. to 1400° C.

10) The method of producing a tantalum sputtering target according to any one of 6) to 9) above, wherein forging and recrystallization annealing are repeated two or more times.

11) The method of producing a tantalum sputtering target according to any one of 6) to 10) above, wherein, after rolling and heat treatment are performed, surface finishing is performed via machining or polishing.

The tantalum sputtering target of the present invention yields superior effects of being able to increase the sputter rate by controlling the crystal orientation on the sputtering surface of the target, consequently deposit the required film thickness in a short period of time, and improve the throughput. In addition, by further controlling the crystal grain size on the sputtering surface of the target, the tantalum sputtering target of the present invention yields superior effects of being able to reduce the discharge voltage of the tantalum target so that plasma can be more easily generated, and improve the stability of the plasma.

The tantalum sputtering target of the present invention is particularly effective in forming a diffusion barrier layer made from a Ta film or a TaN film capable of effectively preventing contamination around the wiring caused by the diffusion of active Cu.

BRIEF DESCRIPTION OF THE DRAWINGS

FIG. 1 is a relationship diagram of the crystal orientation and the sputter rate pertaining to the Examples and Comparative Examples of the present invention.

DETAILED DESCRIPTION

The tantalum sputtering target of the present invention is characterized in reducing the orientation rate of the (200) plane and increasing the orientation rate of the (222) plane on the sputtering surface of the tantalum sputtering target, and causing the average crystal grain size to be 50 μm or more and 150 μm or less, and the variation in the crystal grain size to be 30 μm or less. By controlling the crystal grain size, effects are yielded in that the discharge voltage of the tantalum target can be reduced so that plasma can be more easily generated, and the stability of the plasma can be improved. When the average crystal grain size is outside the range of 50 μm or more and 150 μm or less, in either case the effect of stabilizing the plasma tends to deteriorate.

Note that the grain size was calculated based on the cross sectioning method upon taking a photograph of the structure of the target with an optical microscope. Variation in the grain size is the difference between the maximum value and the minimum value of the grain sizes measured at 9 locations on the target plane. Moreover, the discharge voltage is the average value of the voltages during sputtering at 15 kW for 15 sec. Variation in the discharge voltage is the difference between the maximum value and the minimum value. The discharge abnormality occurrence rate is the number of wafers subject to abnormality/total number of wafers×100 (%) upon performing deposition on wafers.

Meanwhile, since the crystal structure of tantalum is a body-centered cubic lattice structure (abbreviated as BCC), the (222) plane has a shorter interatomic distance than the (200) plane, and the (222) plane is in a state where the atoms are more densely packed than the (200) plane. Thus, during sputtering, it is considered that the (222) plane discharges more tantalum atoms than the (200) plane, which in turn causes the sputter rate (deposition rate) to increase.

In the tantalum sputtering target of the present invention, the orientation rate of the (200) plane on the sputtering surface thereof is preferably 70% or less and the orientation rate of the (222) plane on the sputtering surface thereof is preferably 10% or more. More preferably, the orientation rate of the (200) plane is 60% or less, and the orientation rate of the (222) plane is 20% or more.

Note that, in order to obtain a stable crystal structure, the orientation rate of the (200) plane is preferably 50% or more, and the orientation rate of the (222) plane is preferably 30% or less. The lower limit of the orientation rate of the (200) plane is desirably 30%, and the upper limit of the orientation rate of the (222) plane is desirably 40%.

While there is no particular limitation in the lower limit of the orientation rate of the (200) plane and the upper limit of the orientation rate of the (222) plane, when the orientation rate of the (200) plane is lower than 30% and when the orientation rate of the (222) plane is greater than 40%, the sputter rate will exceed 10 Å/sec, and it becomes difficult to obtain a uniform barrier film since the deposition time becomes too short upon depositing a thin Ta barrier film. Nevertheless, when required, the lower limit of the orientation of the (200) plane may be lower than 30% and the upper limit of the orientation rate of the (222) plane may exceed 40% upon performing sputtering.

In the present invention, the term "orientation rate" refers to a ratio by percentage of a standardized intensity of X-ray diffraction peak of a plane obtained in a surface of a sputtering target to a sum of standardized intensities of X-ray diffraction peaks obtained in the same surface of the same sputtering target and indexed as (100), (200), (211), (310), (222), and (321). The standardization was performed by using JCPDS (Joint Committee for Powder Diffraction) cards. For example, an orientation rate (%) of (200) plane is obtained by a formula:

[{(measured intensity of (200) diffraction peak)/(JCPDS intensity of (200))}/{Σ(measured intensity of diffraction peak of a plane among the planes listed above)/(JCPDS intensity of the same plane)}]×100, where the summation is made of all the planes listed above, i.e. (100), (200), (211), (310), (222), and (321).

The tantalum sputtering target of the present invention may be used for forming a diffusion barrier layer made from a Ta film or a TaN film in a copper wiring. Even in cases of introducing nitrogen into the sputtering atmosphere to deposit a TaN film, the sputtering target of the present invention can increase the sputter rate compared to conventional technologies. Since it is possible to improve the sputtering efficiency as described above, and additionally reduce the discharge voltage of the tantalum sputtering target so that plasma can be more easily generated and improve the stability of plasma by controlling the crystal grain size, the required film thickness can be deposited in a shorter period of time compared to conventional technologies, and the present invention can considerably improve the throughput in the formation of copper wirings comprising a diffusion barrier layer made from a Ta film or a TaN film, and in the manufacture of semiconductor devices comprising such as a copper wiring.

The tantalum sputtering target of the present invention is produced according to the following processes. To illustrate an example, foremost, high purity tantalum having a purity of 4N (99.99%) or higher is normally used as the tantalum raw material. The tantalum raw material is melted via electron beam melting or the like and subsequently cast to prepare an ingot or a billet. Subsequently, the ingot or the billet is subject to forging, and recrystallization annealing. Specifically, for example, the ingot or the billet is subject to press forging—annealing at a temperature of 1100 to 1400° C.—cold forging (primary forging)—annealing at a temperature of recrystallization temperature to 1400° C.—cold forging (secondary forging)—annealing at a temperature of recrystallization temperature to 1400° C.

Cold rolling is subsequently performed. The orientation rate of the tantalum sputtering target of the present invention can be controlled by adjusting the cold rolling conditions. Specifically, a rolling mill roll with a large roll diameter should be used, and preferably the roll diameter is 500 mm or more. Moreover, the rolling speed should be as fast as possible, and preferably 10 m/min or more. In addition, when rolling is only performed once, the reduction is preferably high and in excess of 80%, and when rolling is to be repeated two or more times, the reduction needs to be 60% or higher so that the ultimate thickness of the target becomes the same as the case of only performing rolling once.

Heat treatment is subsequently performed. The orientation rate of the tantalum sputtering target of the present invention can be controlled by adjusting the conditions of the heat treatment performed after cold rolling in addition to adjusting the cold rolling conditions. Moreover, the crystal grain size can also be simultaneously adjusted. Specifically, the heat treatment temperature should be high, and preferably 900 to 1400° C. While this will also depend on the amount of strain that is introduced from the rolling process, heat treatment needs to be performed at a temperature of 900° C. or higher in order to obtain a recrystallized structure. Meanwhile, to perform heat treatment at a temperature that exceeds 1400° C. is undesirable in terms of cost. Subsequently, the surface of the target is subject to surface finishing via machining or polishing in order to obtain the final product.

The tantalum sputtering target is produced based on the foregoing production processes, but what is particularly important in the present invention is to decrease the orientation rate of the (200) plane and increase the orientation rate of the (222) plane in the crystal orientation on the sputtering surface of the target. In addition, from the perspective of reducing the discharge voltage of the tantalum target so that plasma can more easily be generated and improving the stability of the plasma by controlling the crystal grain size on the sputtering surface of the target, the average crystal grain size is caused to be 50 μm or more and 150 μm or less, and the variation in the crystal grain size is caused to be 30 μm or less.

The rolling process and heat treatment are mainly responsible for controlling the crystal grain size. In the rolling process, it is possible to change the amount and distribution of strain that is introduced from the rolling process by controlling parameters such as the diameter of the rolling mill roll, rolling speed, and reduction, and the orientation rate of the (200) plane and the orientation rate of the (222) plane can thereby be controlled.

In order to effectively adjust the crystal grain size or the plane orientation rate, the condition setting needs to be repeated a certain number of times, but once the average crystal grain size is caused to be 50 μm or more and 150 μm or less, and the variation in the crystal grain size is caused to be 30 μm or less, and the orientation rate of the (200) plane and the orientation rate of the (222) plane are adjusted, targets having constant characteristics (characteristics of a constant level) can be produced by setting the manufacturing conditions.

Normally, upon producing a target, it is effective to use a rolling mill roll having a rolling mill roll diameter of 500 mm or more, set the rolling speed to 10 m/min or more, and set the reduction of 1 pass to 8 to 12%. Nevertheless, the production process is not necessarily limited to the foregoing production process so as long as the production process can achieve the adjustment of the crystal grain size and the crystal orientation of the present invention. In the series of processes, a condition setting of destroying the cast structure via forging and rolling and sufficiently performing recrystallization is effective.

In addition, after subjecting the molten tantalum ingot or billet to forging, rolling and other processes, the product is desirably subject to recrystallization annealing to obtain a fine and uniform structure.

EXAMPLES

The present invention is now explained based on the Examples. The following Examples are provided to facilitate the understanding of the present invention, and the present invention is not in any way limited by these Examples. In other words, modifications and other examples based on the technical concept of the present invention are obviously covered by the present invention.

A tantalum raw material having a purity of 99.995% was subject to electron beam melting and casting to obtain an ingot having a diameter of 195 mmφ. Subsequently, the ingot was subject to press forging at room temperature to obtain a diameter of 150 mmφ, and the product was subject to recrystallization annealing at a temperature of 1100 to 1400° C. The product was once again subject to forging at room temperature to obtain a thickness of 100 mm and a diameter of 150 mmφ (primary forging), and the product was subject to recrystallization annealing at a temperature of recrystallization temperature to 1400° C. In addition, the product was subject to forging at room temperature to obtain a thickness of 70 to 100 mm and a diameter of 150 to 185 mmφ (secondary forging), and the product was subject to recrystallization annealing at a temperature of recrystallization temperature to 1400° C. to obtain a target material.

Example 1

In Example 1, the obtained target material was subject to cold rolling using a rolling mill roll having a rolling mill roll diameter of 650 mm at a rolling speed of 20 m/min, and a reduction of 92% to obtain a thickness of 8 mm and a diameter of 520 mmφ, and the product was subject to heat treatment at a temperature of 1000° C. Subsequently, the surface of the product was machined and polished to obtain a target. Based on the foregoing processes, it was possible to obtain a tantalum sputtering target having a crystal structure in which the orientation of the (200) plane is 38.6% and the orientation rate of the (222) plane is 37.8%, an average crystal grain size of 82.1 µm, and a variation in the crystal grain size is 18.8 µm. As a result of sputtering this sputtering target, the sputter rate was favorable at 9.52 Å/sec, and it was possible to improve the sputtering efficiency. Moreover, the discharge voltage was 632.8 V, the discharge voltage variation was 15.0 V, and the discharge abnormality occurrence rate was favorable at 8.1%. The results are shown in Table 1. The sputtering conditions were as follows.

Power source: DC system
Electrical power: 15 kW
Ultimate vacuum: $5 \times 10^{-8}$ Torr
Atmosphere gas composition: Ar
Sputter gas pressure: $5 \times 10^{-3}$ Torr
Sputtering time: 15 seconds Example 2

In Example 2, the obtained target material was subject to cold rolling using a rolling mill roll having a rolling mill roll diameter of 650 mm at a rolling speed of 20 m/min, and a reduction of 66% to obtain a thickness of 24 mm and a diameter of 300 mmφ, and the product was subject to heat treatment at a temperature of 1100° C. The obtained product was once again subject to cold rolling at a reduction of 67% to obtain a thickness of 8 mm and a diameter of 520 mmφ, and the product was subject to heat treatment at a temperature of 900° C. Subsequently, the surface of the product was machined and polished to obtain a target. Based on the foregoing processes, it was possible to obtain a tantalum sputtering target having a crystal structure in which the orientation of the (200) plane is 39.6% and the orientation rate of the (222) plane is 34.5%, an average crystal grain size of 136.9 µm, and a variation in the crystal grain size of 22.7 µm. As a result of sputtering this sputtering target, the sputter rate was favorable at 9.23 Å/sec, and it was possible to improve the sputtering efficiency. Moreover, the discharge voltage was 625.6 V, the discharge voltage variation was 11.7 V, and the discharge abnormality occurrence rate was favorable at 6.9%. The results are shown in Table 1.

Example 3

In Example 3, the obtained target material was subject to cold rolling using a rolling mill roll having a rolling mill roll diameter of 500 mm at a rolling speed of 20 m/min, and a reduction of 91% to obtain a thickness of 8 mm and a diameter of 520 mmφ, and the product was subject to heat treatment at a temperature of 1000° C.

Subsequently, the surface of the product was machined and polished to obtain a target. Based on the foregoing processes, it was possible to obtain a tantalum sputtering target having a crystal structure in which the orientation of the (200) plane is 40.8% and the orientation rate of the (222) plane is 35.7%, an average crystal grain size of 87.7 µm, and a variation in the crystal grain size is 13.4 µm. As a result of sputtering this sputtering target, the sputter rate was favorable at 9.19 Å/sec, and it was possible to improve the sputtering efficiency. Moreover, the discharge voltage was 635.4 V, the discharge voltage variation was 8.3 V, and the discharge abnormality occurrence rate was favorable at 9.8%. The results are shown in Table 1.

Example 4

In Example 4, the obtained target material was subject to cold rolling using a rolling mill roll having a rolling mill roll diameter of 650 mm at a rolling speed of 15 m/min, and a reduction of 65% to obtain a thickness of 24 mm and a diameter of 300 mmφ, and the product was subject to heat treatment at a temperature of 1100° C. The obtained product was once again subject to cold rolling at a reduction of 67% to obtain a thickness of 8 mm and a diameter of 520 mmφ, and the product was subject to heat treatment at a temperature of 900° C. Subsequently, the surface of the product was machined and polished to obtain a target. Based on the foregoing processes, it was possible to obtain a tantalum sputtering target having a crystal structure in which the orientation of the (200) plane is 45.2% and the orientation rate of the (222) plane is 32.7%, an average crystal grain size of 114.8 µm, and a variation in the crystal grain size is 23.8 µm. As a result of sputtering this sputtering target, the sputter rate was favorable at 9.18 Å/sec, and it was possible to improve the sputtering efficiency. Moreover, the discharge voltage was 626.1 V, the discharge voltage variation was 14.4 V, and the discharge abnormality occurrence rate was favorable at 8.2%. The results are shown in Table 1.

Example 5

In Example 5, the obtained target material was subject to cold rolling using a rolling mill roll having a rolling mill roll diameter of 650 mm at a rolling speed of 15 m/min, and a reduction of 90% to obtain a thickness of 8 mm and a diameter of 520 mmφ, and the product was subject to heat treatment at a temperature of 1200° C. Subsequently, the surface of the product was machined and polished to obtain a target. Based on the foregoing processes, it was possible to obtain a tantalum sputtering target having a crystal structure in which the orientation of the (200) plane is 53.4% and the orientation rate of the (222) plane is 21.2%, an average crystal grain size of 129.3 µm, and a variation in the crystal grain size is 25.8 µm. As a result of sputtering this sputtering target, the sputter rate was favorable at 8.96 Å/sec, and it was possible to improve the sputtering efficiency. Moreover, the discharge voltage was 633.3 V, the discharge voltage variation was 18.0 V, and the discharge abnormality occurrence rate was favorable at 8.6%. The results are shown in Table 1.

Example 6

In Example 6, the obtained target material was subject to cold rolling using a rolling mill roll having a rolling mill roll diameter of 500 mm at a rolling speed of 20 m/min, and a reduction of 92% to obtain a thickness of 8 mm and a diameter of 520 mmφ, and the product was subject to heat treatment at a temperature of 900° C. Subsequently, the surface of the product was machined and polished to obtain a target. Based on the foregoing processes, it was possible to obtain a tantalum sputtering target having a crystal structure in which the orientation of the (200) plane is 55.4% and the orientation rate of the (222) plane is 20.4%, an average crystal grain size of 65.3 µm, and a variation in the crystal grain size is 16.2 µm. As a result of sputtering this sputtering target, the sputter rate was favorable at 8.91 Å/sec, and it was possible to improve the sputtering efficiency. Moreover, the discharge voltage was 636.6 V, the discharge voltage variation was 9.6 V, and the discharge abnormality occurrence rate was favorable at 9.6%. The results are shown in Table 1.

Example 7

In Example 7, the obtained target material was subject to cold rolling using a rolling mill roll having a rolling mill roll diameter of 500 mm at a rolling speed of 10 m/min, and a reduction of 90% to obtain a thickness of 8 mm and a diameter of 520 mmφ, and the product was subject to heat treatment at a temperature of 1400° C. Subsequently, the surface of the product was machined and polished to obtain a target. Based on the foregoing processes, it was possible to obtain a tantalum sputtering target having a crystal structure in which the orientation of the (200) plane is 63.9% and the orientation rate of the (222) plane is 16.8%, an average crystal grain size of 146.5 µm, and a variation in the crystal grain size is 23.2 µm. As a result of sputtering this sputtering target, the sputter rate was favorable at 8.86 Å/sec, and it was possible to improve the sputtering efficiency. Moreover, the discharge voltage was 628.5 V, the discharge voltage variation was 11.3 V, and the discharge abnormality occurrence rate was favorable at 7.1%. The results are shown in Table 1.

Example 8

In Example 8, the obtained target material was subject to cold rolling using a rolling mill roll having a rolling mill roll diameter of 500 mm at a rolling speed of 20 m/min, and a reduction of 82% to obtain a thickness of 8 mm and a diameter of 520 mmφ, and the product was subject to heat treatment at a temperature of 900° C. Subsequently, the surface of the product was machined and polished to obtain a target. Based on the foregoing processes, it was possible to obtain a tantalum sputtering target having a crystal structure in which the orientation of the (200) plane is 69.8% and the orientation rate of the (222) plane is 12.1%, an average crystal grain size of 74.8 µm, and a variation in the crystal grain size is 19.4 µm. As a result of sputtering this sputtering target, the sputter rate was favorable at 8.66 Å/sec, and it was possible to improve the sputtering efficiency. Moreover, the discharge voltage was 629.1 V, the discharge voltage variation was 12.1 V, and the discharge abnormality occurrence rate was favorable at 5.6%. The results are shown in Table 1.

Comparative Example 1

In Comparative Example 1, the obtained target material was subject to cold rolling using a rolling mill roll having a rolling mill roll diameter of 650 mm at a rolling speed of 20 m/min, and a reduction of 80% to obtain a thickness of 8 mm and a diameter of 520 mmφ), and the product was subject to heat treatment at a temperature of 800° C. Subsequently, the surface of the product was machined and polished to obtain a target. Based on the foregoing processes, it was possible to obtain a tantalum sputtering target having a crystal structure in which the orientation of the (200) plane is 77.2% and the orientation rate of the (222) plane is 9.6%, an average crystal grain size of 59.4 µm, and a variation in the crystal grain size is 10.2 µm. As a result of sputtering this sputtering target, the discharge voltage was 619.5 V, the discharge voltage variation was 13.8 V, and the discharge abnormality occurrence rate was favorable at 9.4%, but the sputter rate was inferior at 8.27 Å/sec, and caused the throughput to deteriorate. The results are shown in Table 1.

Comparative Example 2

In Comparative Example 2, the obtained target material was subject to cold rolling using a rolling mill roll having a rolling mill roll diameter of 500 mm at a rolling speed of 15 m/min, and a reduction of 80% to obtain a thickness of 8 mm and a diameter of 520 mmφ, and the product was subject to heat treatment at a temperature of 800° C. Subsequently, the surface of the product was machined and polished to obtain a target. Based on the foregoing processes, it was possible to obtain a tantalum sputtering target having a crystal structure in which the orientation of the (200) plane is 78.7% and the orientation rate of the (222) plane is 8.3%, an average crystal grain size of 66.0 µm, and a variation in the crystal grain size is 11.8 µm. As a result of sputtering this sputtering target, the discharge voltage was 618.7 V, the discharge voltage variation was 14.8 V, and the discharge abnormality occurrence rate was favorable at 9.1%, but the sputter rate was inferior at 8.21 Å/sec, and caused the throughput to deteriorate. The results are shown in Table 1.

Comparative Example 3

In Comparative Example 3, the obtained target material was subject to cold rolling using a rolling mill roll having a rolling mill roll diameter of 400 mm at a rolling speed of 10 m/min, and a reduction of 78% to obtain a thickness of 8 mm and a diameter of 520 mmφ, and the product was subject to heat treatment at a temperature of 1100° C. Subsequently, the surface of the product was machined and polished to obtain a target. Based on the foregoing processes, it was possible to obtain a tantalum sputtering target having a crystal structure in which the orientation of the (200) plane is 85.3% and the orientation rate of the (222) plane is 8.0%, an average crystal grain size of 122.8 µm, and a variation in the crystal grain size is 19.2 µm. As a result of sputtering this sputtering target, the discharge voltage was 615.2 V, the discharge voltage variation was 12.9 V, and the discharge abnormality occurrence rate was favorable at 9.7%, but the sputter rate was inferior at 8.05 Å/sec, and caused the throughput to deteriorate. The results are shown in Table 1.

Comparative Example 4

In Comparative Example 4, the obtained target material was subject to cold rolling using a rolling mill roll having a rolling mill roll diameter of 400 mm at a rolling speed of 10 m/min, and a reduction of 75% to obtain a thickness of 8 mm and a diameter of 520 mmφ, and the product was subject to heat treatment at a temperature of 1200° C. Subsequently, the surface of the product was machined and polished to obtain a target. Based on the foregoing processes, it was possible to obtain a tantalum sputtering target having a crystal structure in which the orientation of the (200) plane is 87.5% and the orientation rate of the (222) plane is 6.8%, an average crystal grain size of 133.4 μm, and a variation in the crystal grain size is 23.7 μm. As a result of sputtering this sputtering target, the discharge voltage was 616.8 V, the discharge voltage variation was 17.5 V, and the discharge abnormality occurrence rate was favorable at 5.5%, but the sputter rate was inferior at 7.83 Å/sec, and caused the throughput to deteriorate. The results are shown in Table 1.

Comparative Example 5

In Comparative Example 5, the obtained target material was subject to cold rolling using a rolling mill roll having a rolling mill roll diameter of 650 mm at a rolling speed of 20 m/min, and a reduction of 95% to obtain a thickness of 8 mm and a diameter of 520 mmφ, and the product was subject to heat treatment at a temperature of 700° C. Subsequently, the surface of the product was machined and polished to obtain a target. Based on the foregoing processes, it was possible to obtain a tantalum sputtering target having a crystal structure in which the orientation of the (200) plane is 47.2% and the orientation rate of the (222) plane is 33.4%, an average crystal grain size of 36.8 μm, and a variation in the crystal grain size is 20.4 μm. As a result of sputtering this sputtering target, the sputter rate was favorable at 8.53 Å/sec, and it was possible to improve the sputtering efficiency. Nevertheless, the discharge voltage was 652.1 V, the discharge voltage variation was 33.3 V, and the discharge abnormality occurrence rate was inferior at 15.5%. The results are shown in Table 1.

Comparative Example 6

In Comparative Example 6, the obtained target material was subject to cold rolling using a rolling mill roll having a rolling mill roll diameter of 500 mm at a rolling speed of 20 m/min, and a reduction of 65% to obtain a thickness 24 mm and a diameter 300 mmφ, and the product was subject to heat treatment at a temperature of 1100° C. The product was once again subject to cold rolling at a reduction of 67% to obtain a thickness of 8 mm and a diameter of 520 mmφ, and the product was subject to heat treatment at a temperature of 1000° C. Subsequently, the surface of the product was machined and polished to obtain a target. Based on the foregoing processes, it was possible to obtain a tantalum sputtering target having a crystal structure in which the orientation of the (200) plane is 60.7% and the orientation rate of the (222) plane is 16.9%, an average crystal grain size of 167.2 μm, and a variation in the crystal grain size is 30.2 μm. As a result of sputtering this sputtering target, the sputter rate was favorable at 9.16 Å/sec, and it was possible to improve the sputtering efficiency. Nevertheless, the discharge voltage was 646.9 V, the discharge voltage variation was 24.2 V, and the discharge abnormality occurrence rate was inferior at 18.5%. The results are shown in Table 1.

As shown in the foregoing Examples and Comparative Examples, those within the range of the conditions of the present invention have a high sputter rate and can improve the throughput. Moreover, the relationship between the crystal orientation and the sputter rate in the Examples and Comparative Examples is shown in FIG. 1. As shown in FIG. 1, it can be understood that the sputter rate increases as the orientation of the (200) plane decreases, and as the orientation rate of the (222) plane increases.

Furthermore, the present invention can reduce the discharge voltage of the tantalum sputtering target so that plasma can be more easily generated and improve the stability of the plasma by controlling the crystal grain size on the sputtering surface of the target.

TABLE 1

| | Diameter of rolling mill roll (mm) | Rolling speed (m/min) | Reduction rate of 1 pass (%) | First reduction | First heat treatment | Second reduction | Second heat treatment | (200) orientation rate (%) |
|---|---|---|---|---|---|---|---|---|
| Example 1 | 650 | 20 | 10~12 | 92% | 1000° C. | | | 38.6 |
| Example 2 | 650 | 20 | 8~10 | 66% | 1100° C. | 67% | 900° C. | 39.6 |
| Example 3 | 500 | 20 | 10~12 | 91% | 1000° C. | | | 40.8 |
| Example 4 | 650 | 15 | 10~12 | 65% | 1100° C. | 67% | 900° C. | 45.2 |
| Example 5 | 650 | 15 | 8~10 | 90% | 1200° C. | | | 53.4 |
| Example 6 | 500 | 20 | 8~10 | 92% | 900° C. | | | 55.4 |
| Example 7 | 500 | 10 | 10~12 | 90% | 1400° C. | | | 63.9 |
| Example 8 | 500 | 20 | 10~12 | 82% | 900° C. | | | 69.8 |
| Comparative Example 1 | 650 | 20 | 8~10 | 80% | 800° C. | | | 77.2 |
| Comparative Example 2 | 500 | 15 | 8~10 | 80% | 800° C. | | | 78.7 |
| Comparative Example 3 | 400 | 10 | 10~12 | 78% | 1100° C. | | | 85.3 |
| Comparative Example 4 | 400 | 10 | 8~10 | 75% | 1200° C. | | | 87.5 |
| Comparative Example 5 | 650 | 20 | 10~12 | 95% | 700° C. | | | 47.2 |
| Comparative Example 6 | 500 | 20 | 8~10 | 65% | 1100° C. | 67% | 1000° C. | 60.7 |

| | (222) orientation rate (%) | Crystal grain size (μm) | Variation of grain size (μm) | Ta sputter rate (Å/sec) | Discharge voltage (V) | Voltage Variation (V) | Discharge abnormality occurrence rate (%) | Evaluation |
|---|---|---|---|---|---|---|---|---|
| Example 1 | 37.8 | 82.1 | 18.8 | 9.52 | 632.8 | 15.0 | 8.1 | ◎ |
| Example 2 | 34.5 | 136.9 | 22.7 | 9.23 | 625.6 | 11.7 | 6.9 | ◎ |
| Example 3 | 35.7 | 87.7 | 13.4 | 9.19 | 635.4 | 8.3 | 9.8 | ◎ |

TABLE 1-continued

| | | | | | | | | |
|---|---|---|---|---|---|---|---|---|
| Example 4 | 32.7 | 114.8 | 23.8 | 9.18 | 626.1 | 14.4 | 8.2 | ◉ |
| Example 5 | 21.2 | 129.3 | 25.8 | 8.96 | 633.3 | 18.0 | 8.6 | ○ |
| Example 6 | 20.4 | 65.3 | 16.2 | 8.91 | 636.6 | 9.6 | 9.6 | ○ |
| Example 7 | 16.8 | 146.5 | 23.2 | 8.86 | 628.5 | 11.3 | 7.1 | ○ |
| Example 8 | 12.1 | 74.8 | 19.4 | 8.66 | 629.1 | 12.1 | 5.6 | ○ |
| Comparative Example 1 | 9.6 | 59.4 | 10.2 | 8.27 | 619.5 | 13.8 | 9.4 | X |
| Comparative Example 2 | 8.3 | 66 | 11.8 | 8.21 | 618.7 | 14.8 | 9.1 | X |
| Comparative Example 3 | 8 | 122.8 | 19.2 | 8.05 | 615.2 | 12.9 | 9.7 | X |
| Comparative Example 4 | 6.8 | 133.4 | 23.7 | 7.83 | 616.8 | 17.5 | 5.5 | X |
| Comparative Example 5 | 33.4 | 36.8 | 20.4 | 8.53 | 652.1 | 33.3 | 15.5 | X |
| Comparative Example 6 | 16.9 | 167.2 | 30.2 | 9.16 | 646.9 | 24.2 | 18.5 | X |

Evaluation:
◉: sputter rate at 9.0 Å/sec or higher and discharge abnormality occurrence rate at less than 10%
○: sputter rate at 8.5 Å/sec or higher, and discharge abnormality occurrence rate at less than 10%
X: sputter rate at less than 8.5 Å/sec, or discharge abnormality occurrence rate at more than 10%

The present invention provides a tantalum sputtering target, and by controlling the crystal orientation on the sputtering surface of the target, superior effects are yielded in that the sputter rate can be increased, the required film thickness can consequently be deposited in a short period of time, and the throughput can be improved. In addition, the discharge voltage of the tantalum sputtering target can be reduced so that plasma can be more easily generated, and the stability of the plasma can be improved. Consequently, the tantalum sputtering target of the present invention is particularly effective in forming a diffusion barrier layer made from a Ta film or a TaN film capable of effectively preventing contamination around the wiring caused by the diffusion of active Cu.

The invention claimed is:

1. A tantalum sputtering target, wherein in a sputtering surface of the tantalum sputtering target, an orientation rate of a (200) plane is 38.6% or more and 70% or less, an orientation rate of a (222) plane is 20.4% or more and 37.8% or less, an average crystal grain size is 50 μm or more and 150 μm or less, and a variation by location in the average crystal grain size is 30 μm or less.

2. A method of making a thin film for use as a diffusion barrier layer, comprising the step of using a tantalum sputtering target during a sputtering procedure to form the thin film, wherein in a sputtering surface of the tantalum sputtering target, an orientation rate of a (200) plane is 38.6% or more and 70% or less, an orientation rate of a (222) plane is 20.4% or more and 37.8% or less, an average crystal grain size is 50 μm or more and 150 μm or less, and a variation by location in the average crystal grain size is 30 μm or less.

3. The method according to claim 2, wherein the thin film foiiiis a diffusion barrier layer of a semiconductor device.

4. A method of producing a tantalum sputtering target, wherein a molten tantalum ingot is subject to forging and recrystallization annealing, and thereafter subject to rolling and heat treatment to produce the tantalum sputtering target such that, in a sputtering surface of the tantalum sputtering target, an orientation rate of a (200) plane is 38.6% or more and 70% or less, an orientation rate of a (222) plane is 20.4% or more and 37.8% or less, an average crystal grain size is 50 μm or more and 150 μm or less, and a variation by location in the average crystal grain size is 30 μm or less.

5. The method of producing a tantalum sputtering target according to claim 4, wherein cold rolling is perfoinied using a rolling mill roll having a rolling mill roll diameter of 500 mm or more at a rolling speed of 10 m/min or more and a reduction exceeding 80%.

6. The method of producing a tantalum sputtering target according to claim 4, wherein rolling and heat treatment are repeated two or more times, and cold rolling is performed using a rolling mill roll having a rolling mill roll diameter of 500 mm or more at a rolling speed of 10 m/min or more and a reduction of 60% or more.

7. The method of producing a tantalum sputtering target according to claim 6, wherein heat treatment is performed at a temperature of 900° C. to 1400° C.

8. The method of producing a tantalum sputtering target according to claim 7, wherein forging and recrystallization annealing are repeated two or more times.

9. The method of producing a tantalum sputtering target according to claim 8, wherein, after rolling and heat treatment are performed, surface finishing is performed via machining or polishing.

10. The method of producing a tantalum sputtering target according to claim 5, wherein heat treatment is performed at a temperature of 900° C. to 1400° C.

11. The method of producing a tantalum sputtering target according to claim 10, wherein forging and recrystallization annealing are repeated two or more times.

12. The method of producing a tantalum sputtering target according to claim 11, wherein, after rolling and heat treatment are performed, surface finishing is performed via machining or polishing.

13. The method of producing a tantalum sputtering target according to claim 4, wherein heat treatment is performed at a temperature of 900° C. to 1400° C.

14. The method of producing a tantalum sputtering target according to claim 4, wherein forging and recrystallization annealing are repeated two or more times.

15. The method of producing a tantalum sputtering target according to claim 4, wherein, after rolling and heat treatment are performed, surface finishing is performed via machining or polishing.

* * * * *